(12) United States Patent
Park

(10) Patent No.: US 8,679,301 B2
(45) Date of Patent: Mar. 25, 2014

(54) REPEATABILITY FOR RF MGO TMR BARRIER LAYER PROCESS BY IMPLEMENTING TI PASTING

(75) Inventor: Chang Man Park, Mountain View, CA (US)

(73) Assignee: HGST Netherlands B.V., Amsterdam (NL)

( * ) Notice: Subject to any disclaimer, the term of this patent is extended or adjusted under 35 U.S.C. 154(b) by 1459 days.

(21) Appl. No.: 11/832,318

(22) Filed: Aug. 1, 2007

(65) Prior Publication Data

US 2009/0035462 A1 Feb. 5, 2009

(51) Int. Cl.
*C23C 14/34* (2006.01)

(52) U.S. Cl.
USPC ................................. 204/192.15

(58) Field of Classification Search
USPC ...................... 204/192.15, 298.02
See application file for complete search history.

(56) References Cited

U.S. PATENT DOCUMENTS

| | | | |
|---|---|---|---|
| 5,707,498 A | 1/1998 | Ngan | |
| 6,176,978 B1 | 1/2001 | Ngan | |
| 6,217,715 B1 * | 4/2001 | Sun et al. | 204/192.12 |
| 6,331,484 B1 * | 12/2001 | Bhowmik et al. | 438/648 |
| 6,429,497 B1 | 8/2002 | Nickel | |
| 6,440,879 B1 | 8/2002 | Hixson et al. | |
| 6,468,404 B2 | 10/2002 | Lu et al. | |
| 6,589,398 B1 | 7/2003 | Lu et al. | |
| 6,756,128 B2 | 6/2004 | Carey et al. | |
| 7,252,852 B1 * | 8/2007 | Parkin | 427/131 |
| 7,659,150 B1 * | 2/2010 | Monadgemi et al. | 438/125 |
| 2006/0018057 A1 | 1/2006 | Huai | |
| 2006/0038246 A1 | 2/2006 | Maehara et al. | |
| 2006/0042930 A1 * | 3/2006 | Mauri | 204/192.15 |
| 2006/0056115 A1 | 3/2006 | Djayaprawira et al. | |
| 2006/0060466 A1 | 3/2006 | Kitada et al. | |
| 2007/0111332 A1 * | 5/2007 | Zhao et al. | 438/3 |
| 2009/0148595 A1 * | 6/2009 | Nagamine et al. | 427/131 |

FOREIGN PATENT DOCUMENTS

| | | |
|---|---|---|
| JP | 2115361 | 4/1990 |
| JP | 03014227 A * | 1/1991 |

OTHER PUBLICATIONS

Nagamine, Yoshinori et al., Ultralow resistance-area product of 0.4 Ω(um)2 and high magnetoresistance above 50% in CoFeB/MgO/CoFeB magnetic tunnel junctions, Applied Physics Letters 89, 162507 (2006).*

"TMR Device with World Best Performance Fabricated by Mass Manufacturing System: Gbit MRA is not in sight with the realization of 230% magnetoresistance ratio by the use of sputtering method," 2005 Canon ANELVA Corporation, <http://www.canon-anelva.co.jp/english/news/products/tmr.html>.

(Continued)

*Primary Examiner* — Keith Hendricks
*Assistant Examiner* — John Brayton
(74) *Attorney, Agent, or Firm* — Patterson & Sheridan, LLP

(57) ABSTRACT

A method and apparatus for performing pasting in a deposition chamber. The method includes depositing a Ti pasting layer on at least the interior portion of the deposition chamber by sputtering a Ti target, thereby reducing contaminants in the deposition chamber for subsequent depositions. The method also includes, after depositing the Ti pasting layer on at least the interior portion of the deposition chamber, depositing a second layer on a wafer within the deposition chamber. The second layer comprises at least one of MgO and Mg.

11 Claims, 4 Drawing Sheets

(56) References Cited

OTHER PUBLICATIONS

Tsunekawa et al. "CoFeB/MgO/CoFeB Magnetic Tunnel Junctions with High TMR Ratio and Low Junction Resistance," Magnetics Conference, 2005. INTERMAG Asia 2005. Digests of the IEEE International, Apr. 2005, p. 612.

Hiroshi Maekawa, "Competition Intensifies in Strage Market: AIST and Canon ANELVA accelerated TMR device development," Semiconductor FPD World, 2006, vol. 25(7): pp. 36-38.

* cited by examiner

REPEATABILITY FOR RF MGO TMR BARRIER LAYER PROCESS BY IMPLEMENTING TI PASTING

BACKGROUND OF THE INVENTION

1. Field of the Invention

Embodiments of the present invention generally relate to pasting deposition chambers. Specifically, embodiments of the invention relate to pasted layers in a deposition chamber and methods for pasting layers in a deposition chamber.

2. Description of the Related Art

Deposition chambers are used to fabricate wafers by depositing thin film layers of a target material on a wafer placed inside the chamber using sputtering techniques. Deposition chambers are used because they create an environment more conducive to depositing desired layers on a wafer. The environment may include certain useful chemicals and reduce undesired chemicals. Deposition chambers typically deposit material by sputtering. Sputtering uses a magnetic coil to excite particles (e.g., particles of an inert gas) in a deposition chamber. The excited particles may then impact a target, thereby causing particles of the target material to be ejected from the target and deposited as a layer on a wafer.

Wafers fabricated in deposition chambers are generally semiconductor devices, and can be, for example, magnetic read heads and/or magnetic random access memory (MRAM) devices. While a deposition chamber may provide an environment with reduced contaminants, in some cases, not all contaminants may be removed from the deposition chamber. Typically, the contaminants in the deposition chamber may diminish certain desirable properties of a given layer that is deposited onto the wafer. Properties that may be diminished by the presence of contaminants in the deposition chamber may include desired magnetic properties of magnetic read heads fabricated on a wafer.

Accordingly, there is a desire to find improved method and apparatus for reducing contaminants in a deposition chamber.

SUMMARY OF THE INVENTION

The present invention generally provides a method for performing pasting in a deposition chamber. The method includes depositing a Ti pasting layer on at least the interior portion of the deposition chamber by sputtering a Ti target, thereby reducing contaminants in the deposition chamber for subsequent depositions. The method also includes, after depositing the Ti pasting layer on at least the interior portion of the deposition chamber, depositing a second layer on a wafer within the deposition chamber, wherein the second layer comprises at least one of MgO and Mg.

One embodiment of the invention also provides a deposition chamber including a wafer and a sputtering apparatus. The sputtering apparatus is configured to deposit a Ti pasting layer on at least the interior portion of the deposition chamber by sputtering a Ti target within the deposition chamber, thereby reducing contaminants in the deposition chamber for subsequent depositions. The sputtering apparatus is also configured to, after depositing the Ti pasting layer, deposit a second layer on a wafer within the deposition chamber, wherein the second layer comprises at least one of MgO and Mg.

One embodiment of the invention further provides a method for performing pasting in a deposition chamber. The method includes depositing a TiTa pasting layer on at least the interior portion of the deposition chamber by sputtering a TiTa target, thereby reducing contaminants in the deposition chamber for subsequent depositions. The method further includes, after depositing the TiTa pasting layer on at least the interior portion of the deposition chamber, depositing a second layer on a wafer within the deposition chamber, wherein the second layer comprises at least one of MgO and Mg.

Another embodiment of the invention provides a deposition chamber including a wafer and a sputtering apparatus configured to deposit a TiTa pasting layer on at least the interior portion of the deposition chamber by sputtering a TiTa target within the deposition chamber, thereby reducing contaminants in the deposition chamber for subsequent depositions. The sputtering apparatus is also configured to, after depositing the TiTa pasting layer, deposit a second layer on a wafer within the deposition chamber, wherein the second layer comprises at least one of MgO and Mg.

One embodiment of the invention also provides a method for performing pasting in a deposition chamber. The method includes depositing a Ti pasting layer on at least the interior portion of the deposition chamber by sputtering a Ti target, thereby reducing contaminants in the deposition chamber for subsequent depositions, wherein the Ti pasting layer is at least approximately 100 Angstroms thick. The method also includes depositing a second layer on a wafer in the deposition chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
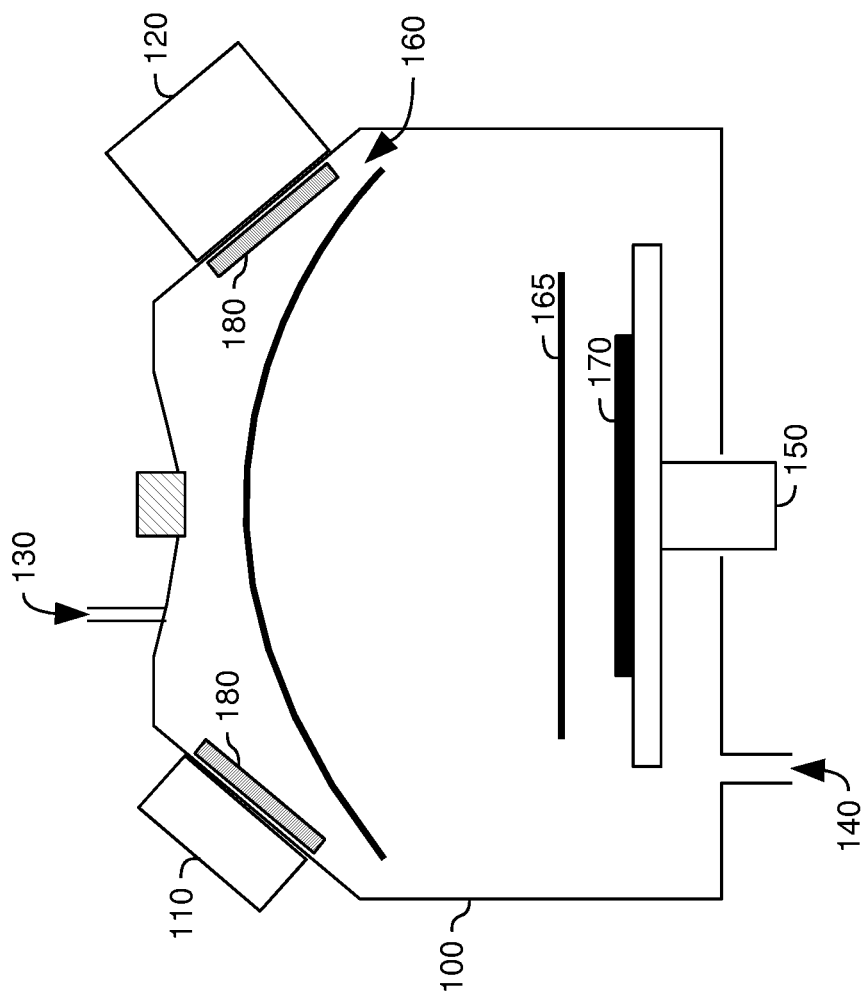
FIG. 1 is a block diagram depicting a deposition chamber according to one embodiment of the invention.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Embodiments of the present invention provide a method for performing pasting in a deposition chamber. Pasting is a method whereby contaminants inside a deposition chamber can be reduced, thus reducing contamination of the later deposited layers on the wafer. While the chamber reduces contaminates that the wafer is exposed to during the deposition process, pasting may be used to further reduce those contaminates. Pasting involves depositing (for example, by sputtering) a target material onto the interior surfaces inside the deposition chamber. Pasting causes a layer of the target material to be coated onto the interior surfaces of the deposition chamber. The pasted layer reduces contaminants inside the chamber by binding undesired particles to the pasted layer such that the undesired particles can not contaminate the wafer during subsequent layer depositions.

The pasted layer can also prevent flaking of already deposited material. Flaking refers to particles of an already deposited material breaking off the interior surfaces inside the deposition chamber. Flaking occurs when there is buildup of a sputtered material that is under stress. Particles that flake off may contaminate the wafer. Pasting prevents flaking by acting as a glue layer which secures the already deposited material on the interior of the chamber by covering up the deposited material with a strong layer that may not easily flake off.

In one embodiment of the invention, the method for performing pasting includes depositing a Ti pasting layer on at least the interior portion of the deposition chamber by sputtering a Ti target, thereby reducing contaminants in the deposition chamber for subsequent depositions, and after depositing the Ti pasting layer on at least the interior portion of the deposition chamber, depositing a second layer on a wafer within the deposition chamber. The second layer comprises at least one of MgO or Mg. By depositing a Ti pasting layer on at least the interior portion of a deposition chamber, contaminants in the deposition chamber, including water, are reduced. This reduction of contaminants leads to increased purity of the layers deposited on a wafer that are deposited in the pasted chamber.

Increased purity of the layers deposited a wafer may improve performance of the layers. For example, the deposited layers may be used to form a magnetic read head which may be used to read data in a hard drive. Where the layers are used to form a magnetic read head, it may lead to better magnetic coupling of the layers, which, for example, may increase the tunneling magnetoresistive (TMR) ratio of magnetic read heads formed on the wafer. The TMR ratio is a measure of the change of electrical resistance in the read head when the read head is exposed to equal strength magnetic fields of opposite orientation. The larger the TMR ratio, the more sensitive the read head. Thus, a read head with a higher TMR ratio can be used in a higher storage capacity hard drive. In addition to increasing purity levels, depositing a Ti pasting layer on at least the interior portion of a deposition chamber may also make high volume manufacturing possible because Ti pasting may provide lower contaminants and impurity on a long-term basis, thereby providing a high repeatability of the MgO or Mg deposition process and higher quality tunneling layers over the course of the manufacturing process.

FIG. 1 is a block diagram depicting a deposition chamber 100 according to one embodiment of the invention. The deposition chamber 100 may include at least a first coil 110 and a second coil 120. As depicted, the first coil 110 may be a DC coil and the second coil 120 may be a RF coil. The coils 110, 120 may be used to apply appropriate voltage to one or more target 180 such that the target 180 is bombarded with particles (for example, plasma ions) which eject particles of the target material 180 off of the target material 180. Both the DC coil 110 and RF coil 120 may be included in deposition chamber 100 because each of the coils may be used for sputtering different types of target materials 180.

The deposition chamber 100 may include a first valve 130 and a second valve 140. The first valve 130 may be a gas injection valve and the second valve 140 may be a reactive gas valve. The gas injection valve 130 may be used to introduce an inert sputtering gas (for example, argon) into the deposition chamber 100. The reactive gas valve 140 may be used to introduce gas which reacts chemically with particles from the target material to create the desired deposited material. For example, oxygen gas may be used with a magnesium target 180 to deposit magnesium-oxide onto the wafer 170.

The deposition chamber 100 also may include wafer stage 150 for holding the wafer 170 during deposition. Wafer stage 150 may be able to rotate, which may lead to the sputtered particles distributing more evenly on the wafer 170. The deposition chamber 100 may further include a first shutter 160 and a second shutter 165. Shutter 160 may be a target shutter, and shutter 165 may be a wafer shutter. The shutters 160, 165 may be in open or closed position during sputtering. The shutters 160, 165 may be used to block certain areas in the deposition chamber 100 from having material sputtered onto them. For example, when wafer shutter 165 is in the closed position, wafer shutter 165 blocks wafer stage 150 from sputtered material.

The wafer 170 may be placed upon the wafer stage 150. The wafer 170 may be used to fabricate TMR read/write heads. In one embodiment, the wafer 170 may have layers deposited on it for a plurality of sensors. The wafer 170 provides a substrate upon which layers for the group of sensors are deposited. Once desired layers for the sensors have been deposited on the wafer 170, the wafer 170 may be cut up into individual sensors that can be placed in a disk drive as described below. While the wafer 170 is described with respect to a TMR read sensor, embodiments of the invention may be utilized with any type of read sensor known to those skilled in the art.

Target material 180 may be placed inside deposition chamber 100. The target material 180 is the material that is being sputtered. Target material 180 can either be pasted onto at least the interior portion of the deposition chamber 100 or deposited onto the wafer 170. In one embodiment, target material 180 may be used in conjunction with at least one DC coil 110. In another embodiment, target material 180 may be Titanium (Ti) and may be pasted onto at least the interior portion of the deposition chamber 100. In another embodiment, target material 180 may be a Titanium alloy (TiX) such as Titanium-Tantalum (TiTa) and may be pasted onto at least the interior portion of the deposition chamber 100. When target material 180 is pasted on at least the interior portion of the deposition chamber 100, contaminants in the deposition chamber 100, including water, may be reduced. Water may be reduced, for example, when water particles combine with, or are bound by, particles of the target material 180 during pasting. In one embodiment, the wafer shutter 165 may be in the closed position during pasting so target material 180 does not get pasted onto wafer stage 150 or wafer 170. In another embodiment, shutters 160, 165 are in the opened position during pasting.

In another embodiment, target material 180 may be Magnesium (Mg) and may be pasted onto at least the interior portion of the deposition chamber 100. In another embodiment, target material 180 may be Mg and may be deposited onto wafer 170. In another embodiment, target material 180 may be Mg, and oxygen may be introduced by reactive gas valve 140. Mg particles and oxygen particles may react during deposition to form magnesium-oxide (MgO) and may be deposited onto wafer 170. In another embodiment, the RF coil 120 may be used for pasting MgO directly on the wafer 170.

In one embodiment, the deposition chamber 100 may be a physical vapor deposition chamber (PVD). In one embodiment, the deposition chamber 100 may be a Canon-Anelva C-7100 PVD sputtering chamber, which has two DC coils 110 and two RF coils 120. In another embodiment, the deposition chamber 100 may be a chemical vapor deposition (CVD) chamber. In another embodiment, the deposition chamber 100 may be an atomic layer deposition (ALD) chamber. In such cases, a sputtering cathode may be added to the CVD or ALD chamber. In one embodiment, the cathode may be designed to prevent cross-contamination from CVD or ALD liquid or gas pre-cursors.

Figure 2:
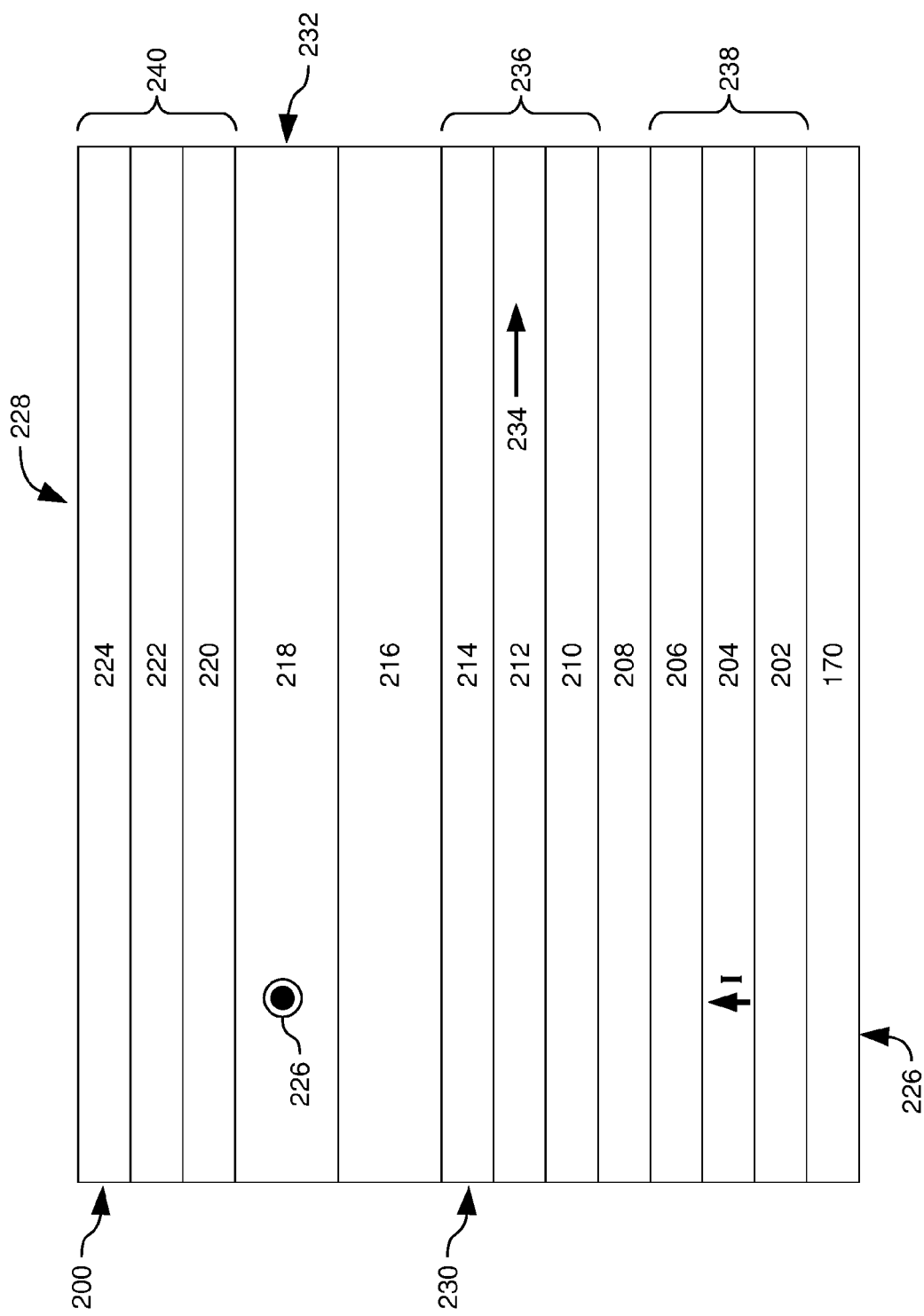
FIG. 2 is a block diagram depicting exemplary layers included in a magnetic read sensor deposited on a wafer according to one embodiment of the invention.

FIG. 2 is a block diagram depicting exemplary layers included in a magnetic read sensor 200 deposited on a wafer 170 according to one embodiment of the invention. In one embodiment, wafer 170 may have layers deposited on it to create a magnetic read sensor 200. As described below, pasting may be used during deposition of the layers of the magnetic read sensor 200 to improve the quality of the magnetic read sensor 200. In the depicted embodiment, a tunneling magnetoresistive (TMR) read sensor 200 is shown in which current I tunneling through a tunnel barrier layer 216 is affected by the alignment of a magnetic field 226 in a free layer 218 (the magnetic field 226 may be changed, e.g., due a magnetic charge stored on a disk) and a pinned layer 236 with a magnetic field 234 which is pinned to a given alignment by an antiferromagnetic (AFM) pinning layer 208. The magnetic read sensor 200 may have a bottom side 226, top side 228, a side 230 which acts as an air bearing surface (ABS), and a back surface 232 opposite the ABS side 230. The layers making up the magnetic read sensor 200 may have improved purity when the layers are deposited in a chamber that has been pasted as described herein. While described with respect to a TMR read sensor, embodiments of the invention may be utilized with any type of read sensor known to those skilled in the art.

As depicted, the magnetic read sensor 170 may include a seed layer 238. The seed layer 238 may be used to provide a base upon which subsequent layers are deposited. The seed layer 238 may be composed of multiple layers. The seed layers may include a Tantalum (Ta) seed layer 202 which may be approximately 30 Angstroms (Å) thick. The seed layer 238 may also include a Nickel-Iron-Chromium (NiFeCr) seed layer 204 which may be approximately 20 Å thick which may be deposited on the Ta seed layer 202. The seed layer 238 may also include a Nickel-Iron (NiFe) seed layer 206 which may be approximately 8 Å thick which may be deposited on the NiFeCr seed layer 204. Seed layers 202, 204, and 206 are exemplary seed layers.

In one embodiment, a pinning layer 208 may be deposited on the seed layer 238. The pinning layer 208 may be composed of Iridium-Manganese-Chromium (IrMnCr) which may be approximately 60 Å thick. Deposited on the pinning layer 208 may be a pinned layer 236. The pinning layer 208 may fix the direction of a magnetization 234 of the pinned layer 236 substantially in a direction directed from right to left or from left to right. In one embodiment, the pinned layer 236 may be composed of three layers. In one embodiment, pinned layer 210 may be composed of Cobalt-Iron ($Co_{25}Fe$) which may be approximately 17 Å thick and may be deposited on the pinning layer 208. Pinned layer 212 may be composed of Ruthenium (Ru) which may be approximately 5 Å thick and may be deposited on pinned layer 210. Pinned layer 214 may be composed of Cobalt-Iron-Boron ($CO_{34}Fe_{15}B$) which may be approximately 16 Å thick and may be deposited on pinned layer 212.

In one embodiment, a tunnel barrier layer 216 may be deposited on the pinning layer 236, followed by a free layer 218. In one embodiment, the tunnel barrier layer 216 may be composed of Magnesium-Oxide (MgO). Optionally, in some cases, the barrier layer 216 may include a plurality of layers. In one embodiment, the barrier layer 216 may consist of a first layer and second layer. The tunnel barrier layer 216 may be composed of a second MgO layer deposited on a first Magnesium (Mg) layer. In another embodiment, the tunnel barrier layer 216 may be composed of a second Mg layer deposited on a first MgO layer. In another embodiment, the tunnel barrier layer 216 may consist of a first layer, a second layer, and a third layer. The tunnel barrier layer 216 may be composed of a first layer of Mg deposited on a second layer of MgO, further deposited on a third layer of Mg.

As mentioned above, the free layer 218 may provide a magnetic field 226 directed either out of the sensor or into the magnetic read sensor 200. Alignment of the magnetic field 226 within the free layer 218 may be changed according to which data is stored in a magnetic disk. The alignment of the magnetic field 226 may in turn affect the current I flowing through the read sensor 200. By measuring the current I, the data stored in a magnetic disk may be read. In one embodiment, the tunnel barrier layer 216 may be deposited after the deposition chamber 100 has undergone at least one of Ti or TiX pasting. As described above, Ti or TiX pasting may increasing the purity in the deposition chamber 100 and resulting in better magnetic coupling between the tunnel barrier layer 216 and the free layer 218.

After the free layer 218, a shield layer 240 may be deposited onto read sensor 200. The shield layer 240 may provide magnetic shielding to reduce noise and thereby improve sensitivity of the sensor 200. The shield layer may be formed from nickel-iron (NiFe) by sputtering NiFe onto the sensor 200 and/or plating the sensor 200 with NiFe. Other layers, such as a capping layer, may also be added to the sensor layers (e.g., below the shield layer 240) to protect the sensor 200 from damage during following processing steps such as wet, photo, or dry etching processing steps. In one embodiment, the shield layer 240 may consist of three layers, 220, 222, and 240. As depicted, the first shield layer 220 may be composed of Ruthenium (Ru) which may be approximately 30 Å thick and may be deposited on free layer 218. The second shield layer 222 may be composed of Tantalum (Ta) which may be approximately 30 Å thick and may be deposited on the first shield layer 220. The third shield layer 224 may be composed of Ru which may be approximately 40 Å thick and may be deposited on the second shield layer 222.

As depicted, seed layer 238, pinning layer 208, and pinning layers 236 compose a bottom group of layers deposited onto wafer 170. Free layer 218 and shield layer 240 compose the top group of layers deposited onto wafer 170. In general, the depicted layers are exemplary layers and a read sensor 200 may, in some cases, contain more layers or fewer layers at different thicknesses as known to those skilled in the art. Similarly, materials other than those shown may be used for given layers as known to those skilled in the art.

Figure 3:
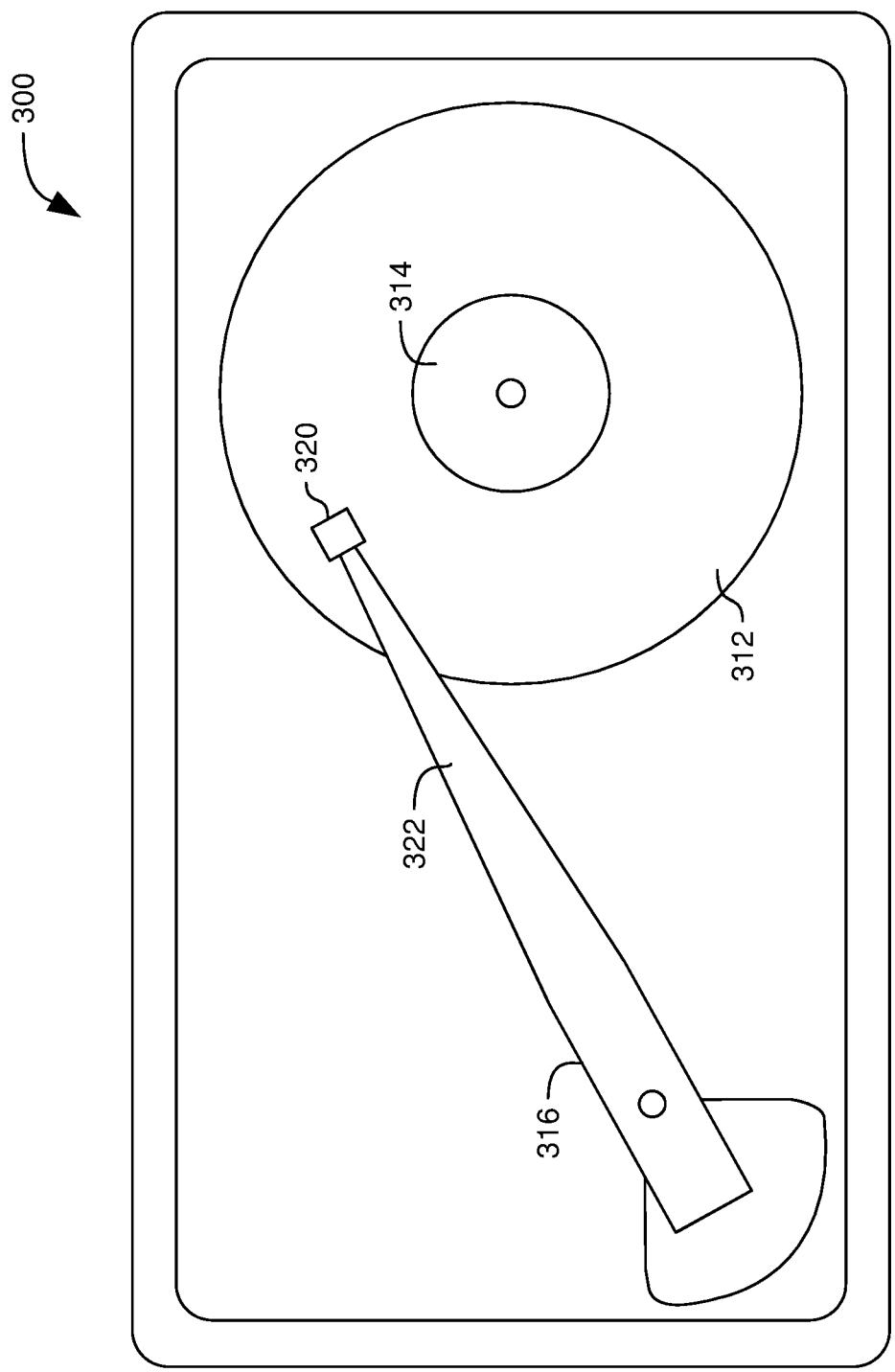
FIG. 3 is a block diagram depicting a hard drive according to one embodiment of the invention.

FIG. 3 is a block diagram depicting a hard drive 300 according to one embodiment of the invention. The hard disk drive 300 includes a magnetic media hard disk 312 mounted upon a motorized spindle 314. An actuator arm 316 is pivotally mounted within the hard disk drive 300 with a slider 320 disposed upon a distal end 322 of the actuator arm 316. During operation of the hard disk drive 300, the hard disk 312 rotates upon the spindle 314 and the slider 320 acts as an air bearing surface (ABS) adapted for flying above the surface of the disk 312. The slider 320 includes a substrate base upon which various layers and structures that form a magnetic read/write sensor are fabricated. As described above, magnetic read/write sensors disclosed herein such as sensor 200, can be fabricated in large quantities upon a substrate, such as wafer 170, and subsequently sliced into discrete magnetic read/write sensors for use in devices such as the hard disk drive 300. By using a pasting layer as described herein, when creating a TMR read sensor 200 used in a hard disk drive 300, the hard disk drive 300 may provide a higher data storage density due to the increased sensitivity of the TMR read sensor 200 resulting from increased purity of the sensor layers.

Figure 4:
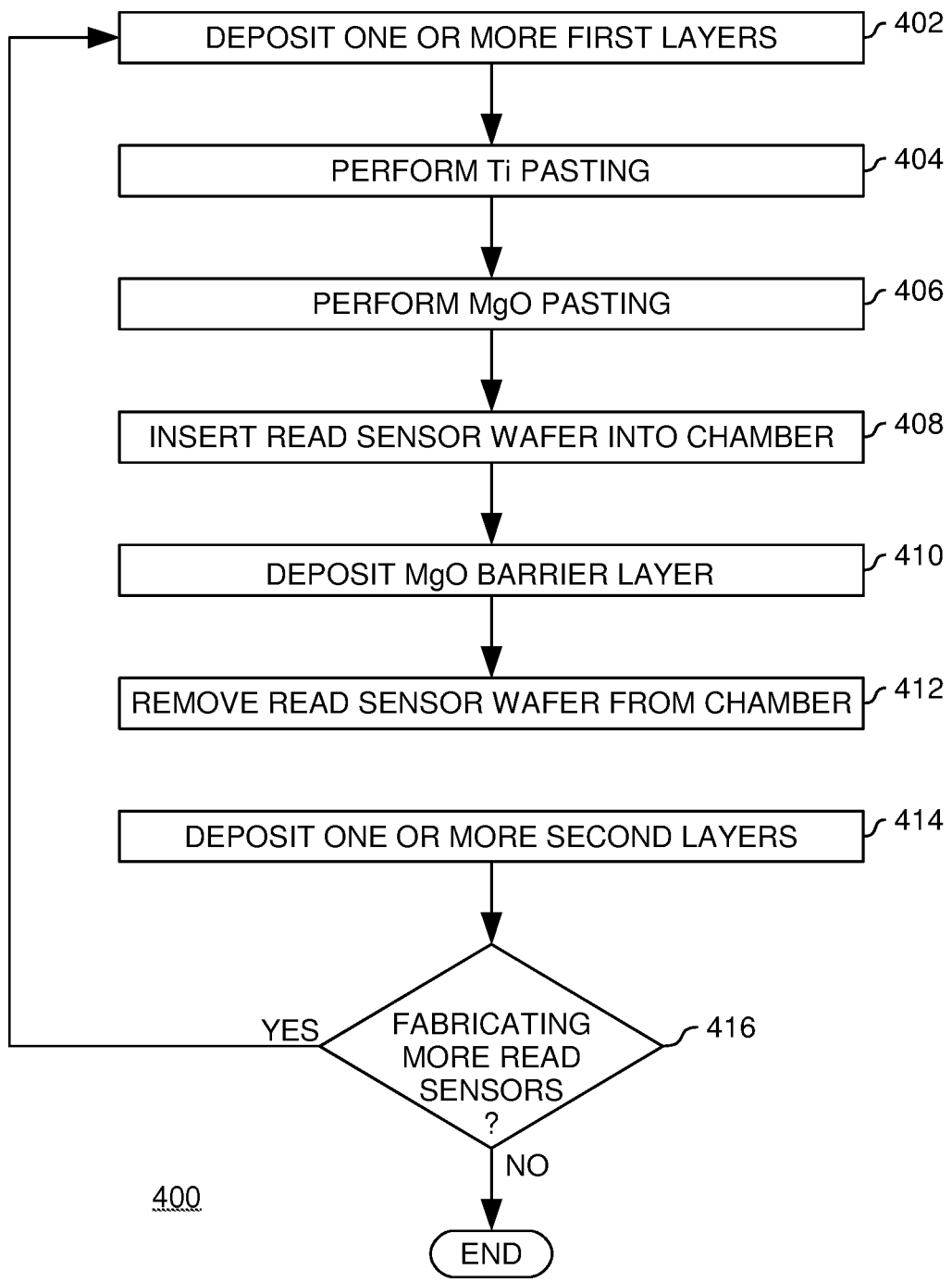
FIG. 4 is a flow diagram depicting a method for pasting a deposition chamber and depositing layers on a wafer according to one embodiment of the invention.

FIG. 4 is a flow diagram depicting a method 400 for pasting a deposition chamber 100 and depositing layers on a wafer 170 according to one embodiment of the invention. The first group of layers of the TMR read sensor 200 may be deposited onto the wafer 170 at step 402. The first group of layers may include the seed layer 238, the pinning layer 208, and the pinned layer 210. In one embodiment, TMR read sensor 170 may have no prior layers deposited on it before being placed in deposition chamber 100. In another embodiment, TMR read sensor 200 may already have at least a portion or all of the first layers deposited on it before the TMR read sensor 200 is placed into the deposition chamber 100 at step 402. For example, step 402 may be performed in one or more deposition chambers other than the deposition chamber 100 in which pasting is performed.

At step 404, at least a portion of the interior of the deposition chamber 100 may be pasted with at least one of Ti or an alloy TiX. In one embodiment, the TiX alloy may consist of TiTa. In one embodiment, before or during pasting, the gas injection valve 130 may introduce an inert sputtering gas, such as Argon, into deposition chamber 100. In one embodiment of the invention, target 180 may be a Ti target which is sputtered to paste at least a portion of the interior of the deposition chamber 100. In one embodiment, wafer shutter 165 is in closed position. In another embodiment, shutters 160, 165 are in open position. Also, in some cases, the wafer 170 may be placed in the chamber 100 during the pasting process. In other cases, the wafer 170 may be outside of the chamber during the pasting process. By performing the pasting step 404, contaminants in the deposition chamber 100, such as water, may be reduced, leading to increased purity of layers deposited on wafer 170.

In one embodiment, step 404 may be performed for a duration of time sufficient to deposit a desired thickness of the pasting layer. The desired thickness may cause sufficient coating of the chamber to reduce contaminants to a desired level. In one embodiment, at least one of the Ti or TiTa pasting layers may be between approximately 100 Å thick and approximately 500 Å thick. In one embodiment, the Ti pasting layer may be approximately 1500 Å thick. In one embodiment, step 404 may be performed for up to 100 seconds.

In another embodiment, at step 404, the deposition chamber 100 may be pasted with target 180 which may consist of a Ti alloy, TiX. As mentioned above, the TiX alloy may consist of TiTa. Pasting the deposition chamber 100 with a TiTa target 180 may also decrease the contaminants in the deposition chamber 100. Additionally, in another embodiment, pasting of Ti and TiX layers may be performed to create one or more alternating layers of Ti and TiX. In one embodiment, the alternating layers may be formed from Ti and TiTa. In some cases, where pasting is performed with TiTa, the total pasting time for Ti and Ta may be reduced.

At step 406, a second pasting step may be performed to paste target material 180 upon at least the interior portion of the deposition chamber 100. In one embodiment, the second pasted layer may consist of MgO. In another embodiment, step 406 may be skipped, and no second layer is pasted upon at least the interior portion of the deposition chamber 100. Additional pasting in step 406 may be skipped, for example, because the Ti pasting layer alone may sufficiently reduce contaminants in the chamber 100 with other pasting steps being performed to further reduce contaminants. Skipping step 406 may decrease the time used to deposit the layers (e.g., of a magnetic read sensor) on the wafer 170, thereby improving throughput of the manufacturing process.

Once all pasting layers have been pasted upon at least the interior portion of the deposition chamber 100, at step 408 a wafer 170 may be placed inside the deposition chamber 100. In one embodiment of the invention, wafer 170 may be placed upon wafer stage 150. Alternatively, the wafer 170 may remain in the chamber 100 during pasting, e.g., with the wafer shutter 165 closed, such that step 408 may be omitted in some cases. In one embodiment, layers of the TMR read sensor 200 may be deposited on wafer 170.

At step 410, a tunnel barrier layer 216 may be deposited onto the read sensor 170. In one embodiment, the tunnel barrier layer 216 may consist of one layer of MgO. Where the tunnel barrier layer 216 is MgO, the target 180 may be an Mg target, and oxygen may be introduced into the chamber 100 through reactive gas valve 140. During sputtering, sputtered Mg particles may react with the oxygen to cause a layer of MgO to be deposited on the layers of the sensor 200. In another embodiment, the tunnel barrier layer 216 may be composed of a first layer and a second layer. For example, the tunnel barrier layer 216 may be composed of a first layer of MgO deposited on a second layer of Mg. Where the first layer and the second layer are MgO and Mg, respectively, target 180 may be composed of Mg while step 410 is performed. After deposition of a layer of Mg is performed, oxygen may be introduced into the chamber 100 as described above to perform deposition of the MgO layer. In another embodiment, the tunnel barrier layer 216 may consist of one layer that may be composed of Mg. In another embodiment, the tunnel barrier layer 216 may consist of a first layer, a second layer, and a third layer. The tunnel barrier layer 216 may be composed of a first layer of Mg deposited on a second of MgO, further deposited on a third layer of Mg.

As described above, when the deposition of the tunnel barrier layer 216 at step 410 is performed after the pasting step 404, deposition of the tunnel barrier layer 216 at step 410 may be performed in a deposition chamber 100 with decreased contaminants (e.g., with decreased water vapor). Thus, the tunnel barrier layer 216 deposited on wafer 170 at step 410 may have increased purity. As described above, where the wafer 170 is used for manufacturing TMR read heads 200, the increased purity of tunnel barrier layer 216 may result in a higher TMR ratio, leading to increased sensitivity of the TMR read head 170. As a result, the TMR read head 200 may be used in higher capacity hard drives such as hard drive 300. In another embodiment, where wafer 170 includes a device other than a read sensor, decreased contaminant levels from pasting step 404 may result in subsequent deposited layers having increased purity and quality.

At step 412, wafer 170 may be removed from the deposition chamber 100. In one embodiment, step 412 may be performed once all desired layers have been deposited on wafer 170. Optionally, additional layers may be deposited in one or more other deposition chambers. Thus, at step 414, one or more second layers may be deposited onto the read sensor 170 after tunnel barrier layer 216 is deposited. In one embodiment, the one or more second layers may include the free layer 218 and the shield layer 240 described above. In general, the deposited layers are exemplarily layers, and wafer 170 may have more or fewer layers of different purposes deposited upon wafer 170 as known to those skilled in the art.

At step 416, if it is desired to have additional wafers 170 have layers deposited on them, the method 400 may be repeated. In one embodiment, pasting step 404 may be performed for each wafer 170 that is manufactured. In another embodiment, pasting step 404 may be performed for a group of wafers that is processed, and pasting step 404 may be performed again for subsequent groups of wafers that are processed.

As described above, pasting of Ti or titanium alloys TiX such as TiTa may be used to reduce the contaminants in the deposition chamber 100. For example, the pasted layer may reduce contaminants inside the chamber by binding undesired particles to the pasted layer such that the undesired particles can not contaminate the wafer during subsequent layer depositions. Thus, subsequent deposited layers may be of greater purity, leading to increased quality of devices manufactured in the deposition chamber, such as magnetic read heads. While described above with respect to formation of magnetic read heads embodiments of the invention may be utilized with any type of manufactured device, including any device with a magnesium-oxide (MgO) tunnel barrier layer. For example, such devices may include magnetic random access memory (MRAM) devices.

While the foregoing is directed to embodiments of the present invention, other and further embodiments of the invention may be devised without departing from the basic scope thereof, and the scope thereof is determined by the claims that follow.

What is claimed is:

1. A method for performing pasting in a deposition chamber, comprising:
  depositing a Ti pasting layer on at least an interior portion of the deposition chamber by sputtering a Ti target, thereby reducing contaminants in the deposition chamber for subsequent depositions;
  after depositing the Ti pasting layer, depositing a TiTa pasting layer on the interior portion of the deposition chamber by sputtering a TiTa target;
  after depositing the TiTa pasting layer, sputtering magnesium in a flow of oxygen gas to deposit a MgO pasting layer on at least the interior portion of the deposition chamber; and
  after depositing the MgO pasting layer on at least the interior portion of the deposition chamber, depositing a second layer on a wafer within the deposition chamber, wherein the second layer comprises at least one of MgO and Mg.

2. The method of claim 1, wherein the wafer includes a plurality of layers including the second layer wherein the plurality of layers forms at least one tunneling magnetoresistive read head.

3. The method of claim 1, further comprising:
  after the second layer has been deposited on the wafer and before a third layer is deposited on a second wafer, depositing a Ti pasting layer on at least the interior portion of the deposition chamber.

4. A method for performing pasting in a deposition chamber, comprising:
  depositing a TiTa pasting layer on at least an interior portion of the deposition chamber by sputtering a TiTa target, thereby reducing contaminants in the deposition chamber for subsequent depositions;
  after depositing the TiTa pasting layer, depositing a Ti pasting layer on at least the interior portion of the deposition chamber;
  after depositing the Ti pasting layer, sputtering magnesium in a flow of oxygen gas to deposit a MgO pasting layer on at least the interior portion of the deposition chamber; and
  after depositing the MgO pasting layer on at least the interior portion of the deposition chamber, depositing a second layer on a wafer within the deposition chamber, wherein the second layer comprises at least one of MgO and Mg.

5. The method of claim 4, wherein the wafer includes a plurality of layers including the second layer, wherein the plurality of layers forms at least one tunneling magnetoresistive read head.

6. The method of claim 4, further comprising:
  after the second layer has been deposited on the wafer, and before a third layer is deposited on a second wafer, depositing a further TiTa pasting layer on at least the interior portion of the deposition chamber.

7. A method for performing pasting in a deposition chamber, comprising:
  depositing a TiTa pasting layer on at least an interior portion of the deposition chamber by sputtering a target comprising at least one of Ti and Ta, thereby reducing contaminants in the deposition chamber for subsequent depositions, wherein the TiTa pasting layer is at least approximately 100 Angstroms thick; and
  depositing a second layer on a wafer in the deposition chamber, wherein the second layer comprises at least one of MgO and Mg.

8. The method of claim 7, wherein no MgO pasting layer is pasted on at least the interior portion of the deposition chamber before the second layer is deposited.

9. The method of claim 7, wherein the wafer includes a plurality of layers including the second layer, wherein the plurality of layers forms at least one tunneling magnetoresistive read head.

10. The method of claim 4, wherein depositing the TiTa pasting layer comprises alternating between the TiTa target and a Ti target to deposit alternating layers of Ti and TiTa that form the TiTa pasting layer.

11. The method of claim 1, further comprising, before depositing the MgO pasting layer, repeatedly depositing the Ti pasting layer and the TiTa pasting layer on the interior portion of the deposition chamber.

* * * * *